United States Patent [19]
McClintock et al.

[11] Patent Number: 5,909,375
[45] Date of Patent: *Jun. 1, 1999

[54] BUFFER FOR IDENTIFICATION OF PIN CONTENTIONS IN CIRCUIT DESIGN AND SIMULATION

[75] Inventors: Cameron McClintock, Mt. View; James A. Watson, Santa Clara; Caleb Crome, Mt. View, all of Calif.

[73] Assignee: Altera Corporation, San Jose, Calif.

[21] Appl. No.: 08/716,908

[22] Filed: Sep. 19, 1996

Related U.S. Application Data

[60] Provisional application No. 60/015,121, Apr. 10, 1996.
[51] Int. Cl.$^6$ .................................................. G06F 17/50
[52] U.S. Cl. .......................................... 364/490; 364/578
[58] Field of Search .................................. 364/488, 489, 364/490, 491, 578; 371/22.1, 22.2, 22.5, 22.6, 24, 27.4

[56] References Cited

U.S. PATENT DOCUMENTS

| | | | |
|---|---|---|---|
| 4,617,479 | 10/1986 | Hartmann et al. | 307/465 |
| 4,697,241 | 9/1987 | Lavi | 364/488 |
| 5,260,611 | 11/1993 | Cliff et al. | 307/465 |
| 5,329,630 | 7/1994 | Baldwin | 395/425 |
| 5,623,418 | 4/1997 | Rostoker et al. | 364/489 |
| 5,633,813 | 5/1997 | Srinivasan | 364/578 |

OTHER PUBLICATIONS

"Development Tools," *Altera Databook*, Mar. 1995, Chapter 13, pp. 509–565.

*Primary Examiner*—Kevin J. Teska
*Assistant Examiner*—Leigh Marie Garbowski
*Attorney, Agent, or Firm*—Charles J. Kulas; Townsend and Townsend and Crew

[57] ABSTRACT

A system and method for making and using integrated circuits using a modeling system. The system utilizes a pin test buffer. The pin test buffer inputs external inputs to a pin, and outputs to the same pin from the device. If contention is noted between the system inputs to the pin, and outputs from the device to the pin, contention error notices are provided to the user.

18 Claims, 4 Drawing Sheets

BUFFER FOR IDENTIFICATION OF PIN CONTENTIONS IN CIRCUIT DESIGN AND SIMULATION

CROSS-REFERENCE TO RELATED APPLICATIONS

This application claims the benefit of U.S. Provisional application Ser. No. 60/015,121, filed Apr. 10, 1996.

COPYRIGHT NOTICE

A portion of the disclosure of this patent document contains material which is subject to copyright protection. The copyright owner has no objection to the xeroxographic reproduction by anyone of the patent document or the patent disclosure in exactly the form it appears in the Patent and Trademark Office patent file or records, but otherwise reserves all copyright rights whatsoever.

BACKGROUND OF THE INVENTION

The present invention relates to the field of integrated circuits. More specifically, in one embodiment the invention provides an improved method and device for modeling, testing, and manufacturing integrated circuits.

In the manufacture of integrated circuits, modeling of the circuit behavior has become an important step. In the modeling of a circuit various inputs are applied to a device, the device behavior is simulated, and various outputs are generated. During the modeling process, the designer of an integrated circuit or system is able to ensure that the device generates expected outputs based on selected inputs. The user may also perform a wide variety of other functions including design rule checking. After modeling the device to ensure that the desired behavior is achieved, the designer is able to manufacture a circuit or system with confidence that it will perform in a desired manner.

A wide variety of integrated circuits are modeled by designers in this manner. Exemplary integrated circuits that are modeled by the designer or user of a system include microprocessors, ASICs, gate arrays, and programmable logic devices. One such system includes the Altera MAX+ PLUS II® programmable logic development system and software, and Viewlogic's Viewsim logic simulator.

While meeting with substantial success, prior modeling tools have met with certain limitations. For example, it is possible to inadvertently design the integrated circuit such that a particular pin is used to receive an input and generate an output at the same time.

From the above it is seen that improved integrated circuit design and manufacturing systems and methods are needed.

SUMMARY OF THE INVENTION

An improved integrated circuit design and manufacturing system and method is provided by way of the present invention. According to a preferred embodiment of the invention, the system utilizes a pin test buffer. In an integrated circuit modeler, the pin test buffer receives an input to an integrated circuit pin. It also receives an output from the device on the same pin. If, for example, the input to a pin test buffer from the outside environment is a logic 1 or 0, the pin test buffer attempts to drive the device pin to a 1 or 0; otherwise the pin test buffer attempts to drive the device pin to a logical "Z", or allows the device to drive the pin. If, however, the inputs to the pin test buffer are forced to an opposite state, the system sets a flag indicating that contention at the device pin has taken place, indicating to the user that there is a potential difficulty in the design.

According to one embodiment of the invention, a method for simulating the operation of an integrated circuit is provided. The method includes the steps of receiving external inputs to one or more pins of the integrated circuit at a buffer; simulating operation of the integrated circuit; receiving outputs from said one or more pins of said integrated circuit at the buffer based on the simulating step; and determining if the inputs to one or more of the pins conflicts with the outputs from the pins of said device.

A further understanding of the nature and advantages of the inventions herein may be realized by reference to the remaining portions of the specification and the attached drawings.

DESCRIPTION OF THE PREFERRED EMBODIMENTS

Figure 1:
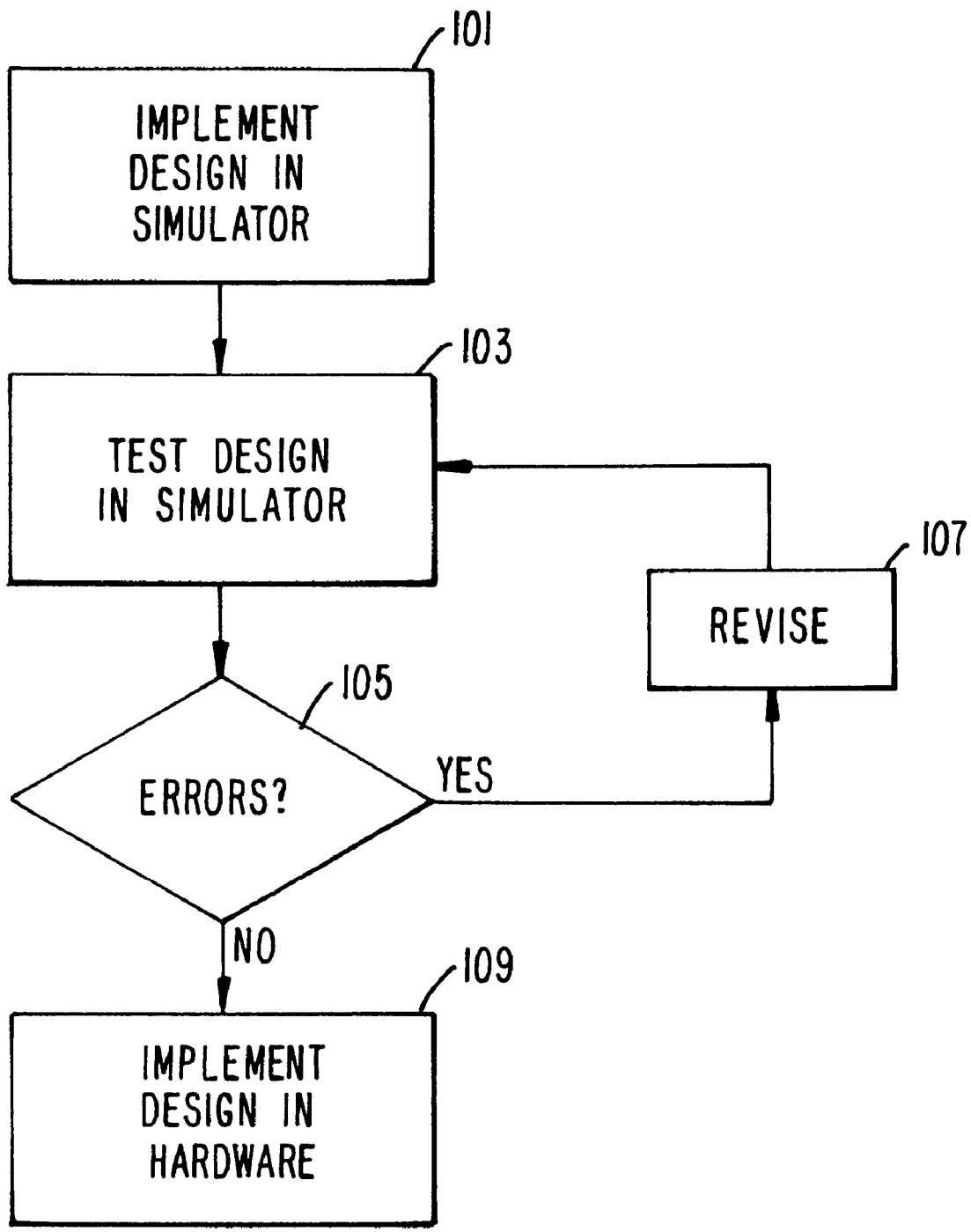
FIG. 1 illustrates an overall method for integrated circuit and electronic system manufacture.

FIG. 1 is an overall flow chart illustrating the manufacture of an electronic system using the invention herein. As shown, at step 101 a design is implemented in a simulator such as a logic simulator. At step 103 the simulator tests the design to determine, among other things, if the design generates the expected outputs based on selected inputs, performs design rule checking, error detection, etc. At step 105 the system (or user based on outputs from the system) determines if one or more errors are noted. If so, at step 107 the design is appropriately modified and the simulator is again tested at step 103. When the system or user detects no further errors the design can be implemented in hardware at step 109.

Figure 2:
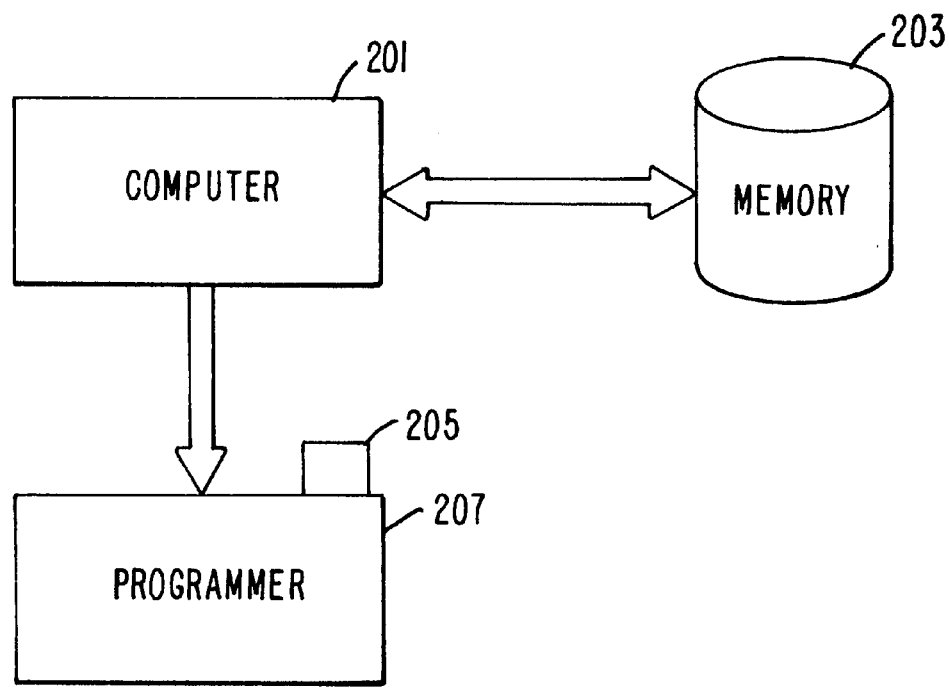
FIG. 2 illustrates a computer system used in one embodiment of the invention.

FIG. 2 illustrates a typical system for implementing the process shown in FIG. 1. As shown, one or more digital computers 201 are used to simulate the integrated circuit using programs, design files, and other information stored on magnetic or other computer readable storage media 203, including the software disclosed herein. In the particular instance of a programmable logic device, the information stored in memory 203 may be used by computer(s) 201 to program the logic device 205 using a programming device 207 such as Altera's MAX+PLUS II programmer.

Figure 3:
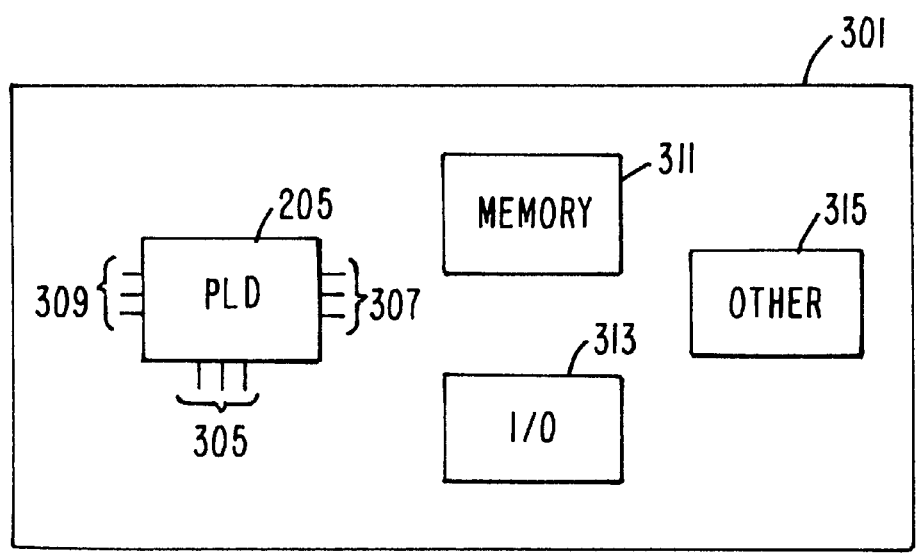
FIG. 3 illustrates a system that is manufactured according to the invention herein.

FIG. 3 illustrates a system 301 in which an integrated circuit manufactured according to the methods herein may be utilized. A programmable logic device 205 is used herein for purposes of example. Programmable logic devices (sometimes referred to as a PALs, PLAs, FPLAs, PLDs, EPLDS, EEPLDs, LCAS, GALs, or FPGAs), are well know integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX™ series of PLDs. The former are described in, for example, the Altera Data Book, September 1991, incorporated herein by reference. The latter are described in, for example, U.S. Pat. No. 5,260,611, and incorporated herein by reference for all purposes. While a programmable logic device is used for illustration, the invention may also be used with other types of integrated circuits such as gate arrays, microprocessors, ASICs, and others.

Programmable logic devices may be used in systems 301 in a wide variety of applications such as, merely by way of example, telecommunications systems, automotive systems, control systems, consumer electronics, personal computers, and others. The system may be provided on a single board, on multiple boards, or even within multiple enclosures. Device 205 is provided by the system with various inputs on pins 305, and provides the system output on pins 307. Pins 305 and 307 in some cases are programmable as input, output or input/output pins and are, therefore, interchangeable even during operation of the device. Other pins 309 may also be connected to the system and include, for example, control pins, and power supply pins. Other integrated circuits in the system may include special purpose integrated circuits, microprocessor(s), memories 311, input/output devices 313 and other integrated circuits 315 of the type known to those of skill in the art.

Figure 4:
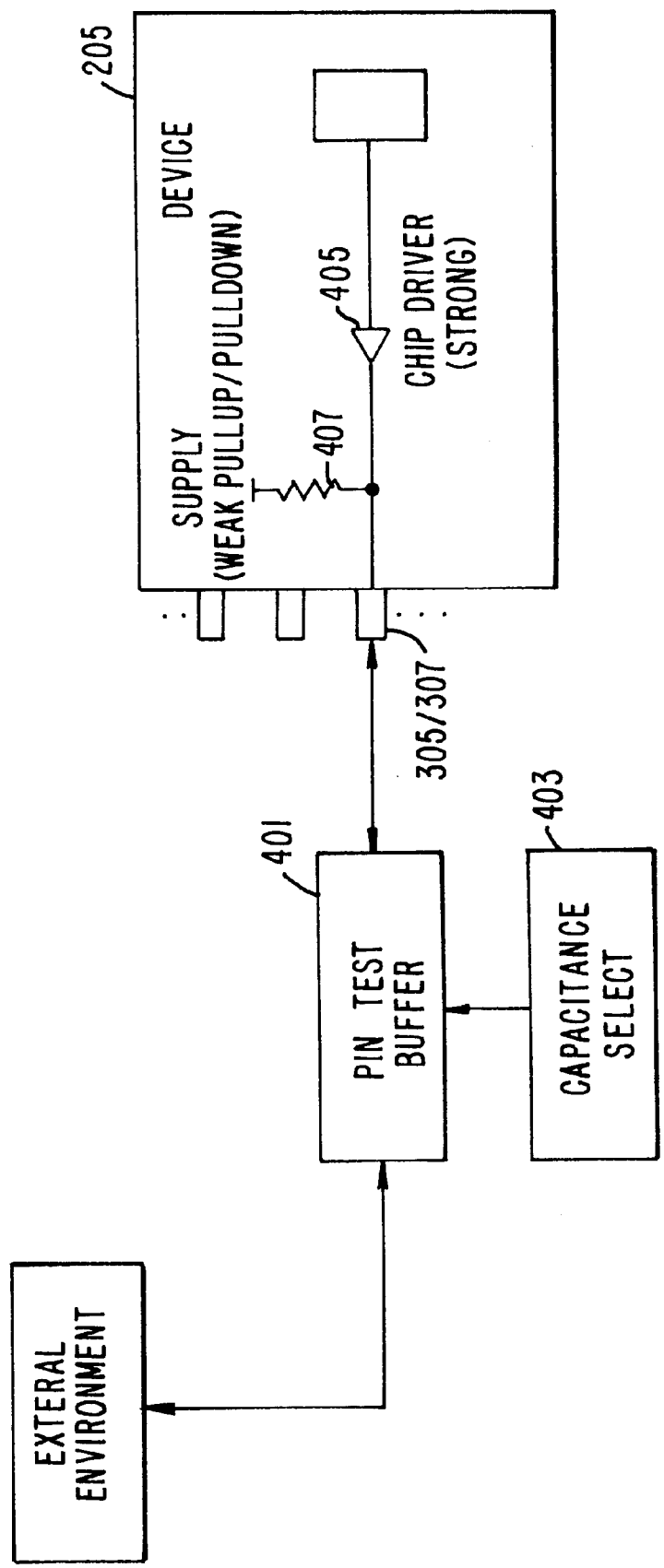
FIG. 4 illustrates the pin test buffer concept and use.

FIG. 4 is an overall system diagram illustrating the pin test buffer technique and device. During simulation of the device 205, inputs (if any) for a pin 305/307 are provided to the pin test buffer 401 from the external environment of the device. It will be recognized that the pin test buffer is not an actual buffer, but in reality a software construct used during simulation. In addition, the pin test buffer receives output (if any) from pin 305/307. The pin test buffer models the pin interface between the device's input/outputs and the external environment into which the device is placed, avoiding the need for a user to tristate the various signals on the pins and avoiding the use for separate pin contention tests elsewhere in the modeling system. The pin test buffer determines if, for example, the inputs to the pin and the outputs from the pin are in conflict. For example, if the device is driving the pin low, and the external environment of the device is attempting to drive the pin high, the pin test buffer (in a computer model) will detect this conflict (or contention), and provide an appropriate indication to the user, such as on a screen display, printout, or audible signal. If there is no conflict between the inputs and outputs, any output from the device will be provided to the external environment, and any input to the device will be provided to the pin for use by the integrated circuit.

The pin test buffer may be designed such that interfaces to the input/output may be passively driven, as illustrated in the specific example in FIG. 4. As shown, the output of the pin test buffer drives the device pin. When the external environment forces a 1 or a 0, the pin test buffer attempts to drive the device pin to a 1 or 0, respectively. If the external environment is not forced to a 1 or 0, the pin test buffer drives out a logical "Z" or high impedance state to the device. This allows the device to determine the state of the pin.

The pin test buffer may also save the state of output of the pin. If, for example, the external environment is not driving the pin, and the device is not driving the pin, the pin test buffer will be modeled as, effectively, a large, non-leaky capacitance. Therefore, the pin test buffer will allow the device to remain in its current state if the node is designated as "capacitance on" with capacitance select element or bit 403.

The pin test buffer will support two strengths of output drive from the device. The first drive strength (indicated by driver 405) will behave as a strong 1 or 0, such as in, for example, CMOS or TTL output driver use. The second (indicated by driver 407) will behave as a weak 1 or 0, such as in a resistive pull up or pull down at the pin of the device. In this particular embodiment, if the external environment is driven to a 1 or 0, the pin test buffer is modeled to "win" against or overwhelm a weakly driven logic level of the opposite state driven from the device. When the external environment is forced to a 1 or 0 and the device attempts to drive out with a strong logic level of the opposite state, the pin test buffer sets a flag or otherwise indicates that contention occurs at the device pin. The logic value at the device pin resolves as a logical X or indeterminant state. In some cases, a warning may also be provided if the external environment drives the same value as the device.

It is possible that, for test purposes, the input to the IC may want to be driven with an "X." Depending on the simulator used, this may be useful for determining that this pin is not influencing the area of the IC being tested at that time. In the unusual case where the user may wish to force the pin of a device to an X state, the user would force the device pin directly with a logic X. This will force this node to X regardless of the drive states of the device and the pin test buffer. Note that in terms of simulators, an X differs from a Z in that "anything" overcomes a Z, but an X has a driver strength, which may or may not be overcome. In Boolean logic, the complement of an X is an X. This terminology is well understood to those of skill in the art (this terminology being applied to Viewlogic in particular).

A detailed truth table for each implementation will differ. However, Table 1 illustrates a truth table used in a specific implementation of a pin test buffer for use in Viewlogic's Viewsim logic simulator. In the table below, D(#) indicates that a pin is driven with driving strength of "Drive" to the logical value #. The terminology D is used in reference to the supported Viewlogic drive strengths of D (drive), W (weak), C (capacitive) and Z (high impedance).

TABLE 1

| EXTERNAL IN | Pin test buffer output drive | Error flag asserted if the device pin resolves as: |
|---|---|---|
| 1 | D1 | Anything but high |
| 0 | D0 | Anything but low |
| unassigned | Z | No contention flag possible |
| else | Z | No contention flag possible |

Figure 5:
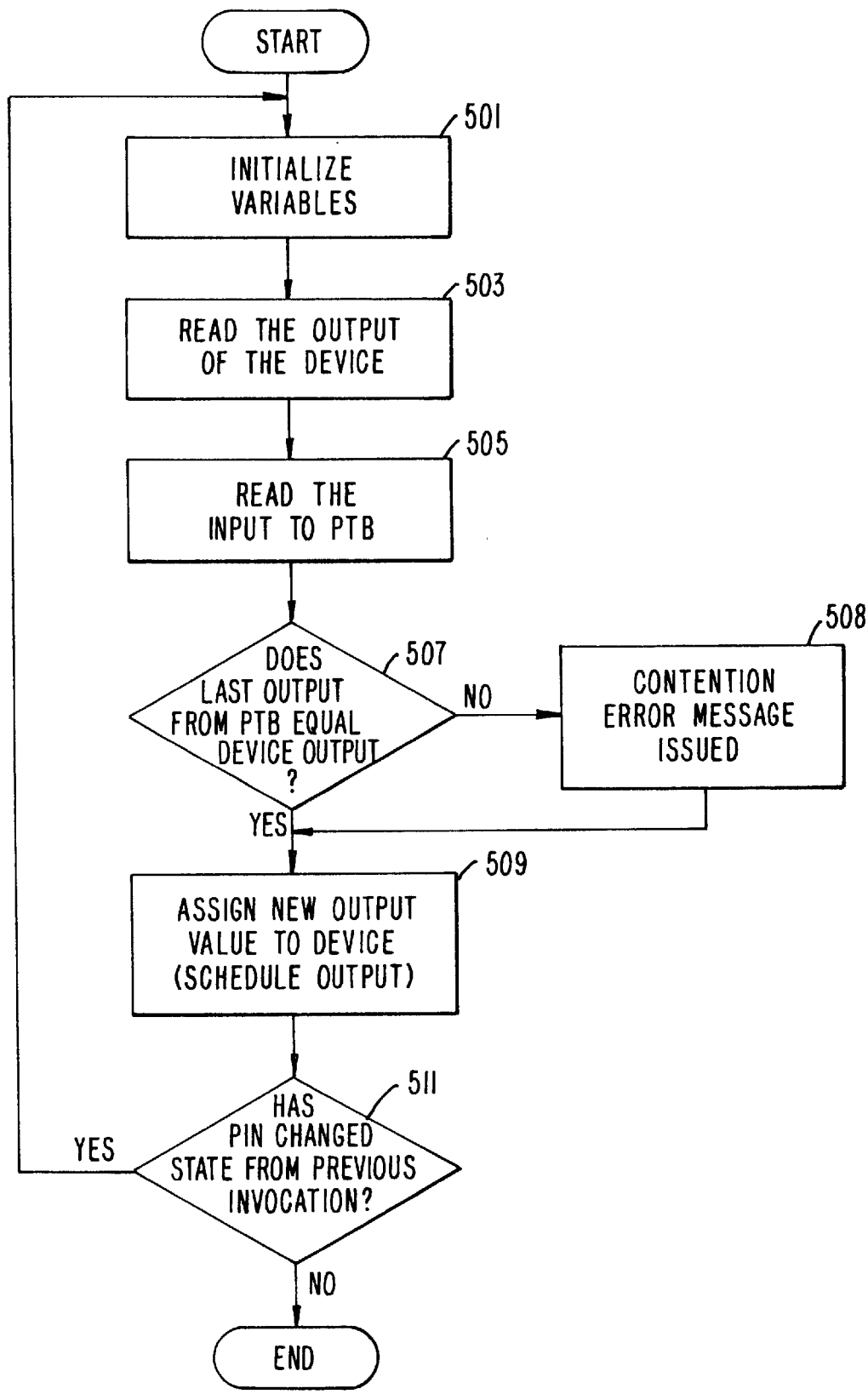
FIG. 5 is a flow chart illustrating operation of the pin test buffer in a software system.

FIG. 5 is an overall flow chart for a specific implementation of a pin test buffer. Appendix 1 (© Copyright 1995, Altera Corporation, All rights reserved) is a particular implementation of the invention implemented in the C programming language for use with a Viewlogic system, via API programming books available from Viewlogic, in association with the simulation of operation of a programmable logic device.

As shown in FIG. 5 the system first initializes the system's variables at step 501. The system then reads in outputs of the device and inputs to the buffer from the external environment at steps 503 and 505, respectively. At step 507 the system determines if the last output from the buffer is the same as the output of the device, to ensure that no errors in, for example, modeling have taken place. If they are not the same, an error is indicated at step 508. At step 509 the system assigns a new value to the output to the device according to, for example, the nomenclature in Table 1 and indicates any contention error. At step 511 the system begins to ask if the pin has changed its value from the device from a previous invocation, and when it has, the process is restarted.

The above description is illustrative and not restrictive. Many variations of the invention will become apparent to those of skill in the art upon review of this disclosure. Merely by way of example the use of programmable logic devices has been used for illustration, but the invention is not so limited. The scope of the invention should, therefore, be determined not with reference to the above description, but instead should be determined with reference to the appended claims along with their full scope of equivalents.

---

Appendix 1

---

```
™ copyright 1995
Altera Corporation
All Rights Reserved
/* pin_buffer.cc: */
/* Author: Caleb Crome */
/* This file impliments a buffer pin that when placed at the pins of a
/* full chip simulation can detect contention between driving stimulus
/* and the chip driving. */
#include <stdio.h>
#include "viewsim.h"
#include <string.h>
#include "global.h"
#define PIN_BUFFER_INPUT_ORD      0
#define PIN_BUFFER_OUTPUT_ORD     1
#define PIN_BUFFER_OUTIN_ORD      2
typedef struct temp_pin_buffer_struct
{
    vsc_in_values OUTPUT;
} pin_buffer_struct;
void *pin_buffer_init(void);
void pin_buffer _eval(pin_buffer_struct *buffer_inst vsc_in_values *pin_array);
void pin_buffer_restart(pin_buffer_struct *inst_id);
void pin_buffer_info(void *inst_id);
void pin_buffer_close(void *inst_id);
void pin_buffer_save(void *inst_id);
void pin_buffer_restore(void *inst_id);
void init_in_buffer_entry(void);
/************************************************************************
 *   Declare the global VSC entry point structure for EEPROM.           *
 ***********************************************************************/
vsc_entries_struct *pin_buffer_entries = NULL;
/************************************************************************
 *   init_pin_buffer_entry : This routine allocate and initialize the ram
 *
 *                           bit entry.                                 *
 *                           This routine only called once for each module. *
 *   Inputs : None.                                                     *
 *   Outputs: Mone.                                                     *
 *   ******************************************************************/
void init_in_buffer_entry(void)
{
    pin_buffer_entries = (vsc_entries_struct *)   vscu_allocate(sizeof(vsc_entries_struct));
        pin_buffer_entries->inst_init      = pin_buffer_init;
        pin_buffer_entries->inst_eval      = pin_buffer_eval;
        pin_buffer_entries->inst_restart   = (vsc_restart) pin_buffer_restart;
        pin_buffer_entries->inst_info      = pin_buffer_info;
        pin_buffer_entries->inst_close     = pin_buffer_close;
        pin_buffer_entries->inst_save      = pin_buffer_save;
        pin_buffer_entries->inst_restore   = pin_buffer_restore;
} /* init_ram_entry */
/*
 * buffer instantiation
 * void *pin_buffer_init(void)
{
    pin_buffer_struct *buffer_inst;
/* register pins */
vscu_define_in(PIN_BUFFER_INPUT_ORD, INPUT);
vscu_define_in(PIN_BUFFER_OUTPUT_ORD, OUTPUT);
vscu_define_in(PIN_BUFFER_OUTIN_ORD, INPUT);
/* allocate bit structure */
buffer_inst = (pin_buffer_struct *)vscu_allocate(sizeof(pin_buffer_struct));
/* assign initial values */
buffer_inst -> OUTPUT = Z;
return (buffer_inst);
}
// From cam@tit Mon Jan 16 17:23:16 1995
// Date: Mon, 16 Jan 95 17:22:24 PST
// From: cam@tit (Cameron McClintock)
```

Appendix 1

```
// To: Caleb@tit
// Subject: Pin Test C-model
// Cc: cam@tit
// Content-Length: 816
// Caleb:
// I've talk to some of the engineers and come up with the
// truth table below. Srinivas questioned whether it is
// possible to do the last line; have an unassigned input
// to the pin test buffer resolve as a z at its output. I
// think we decided this is possible. Also we decided that
// if the input to the pin test buffer is X it should_output
// a "strong" X.
// Srinivas is going to start top level logic simulations very
// soon (~this week). I think the best thing is to go ahead and
// implement the buffer and let them use it. If there are any
// issues with it they should be able to flush them out.
// INPUT            OUTPUT      FLAG A CONTENTION ERROR
//                              IF OUTPUT RESOLVES AS
// 1                D1          anything but high
// 0                D0          anything but low
// X                Z           anything but X
// Z                Z           never flag contention
// unassigned       Z           never flag contention
// Thanks Cameron
void pin_buffer eval(pin_buffer_struct *buffer_inst, vsc_pin_values *pin_array)
{
    extern vsc_pin_4values vsc_28to3_state[];
    vsc_pin_values              input;
    vsc_pin_values              outin;
    vsc_pin_4values             outin4;
    // look at the OUTIN pin.
    outin = pin_array[PIN_BUFFER_OUTIN_ORD];
    outin4 = vsc_28to4_state[outin];
    // get the value of the input pin in the 4 state system
    input = pin_array[PIN_BUFFER_INPUT_ORD];
    // first, check for contention
switch (buffer_inst->OUTPUT)
    {
    case D1:
        if (outin4 != HIGH4) // check for not high
            {
                char *net;
                net = vscu_get_inst_name((void *)buffer_inst);
                vscu_printf("ERROR: The pin connected to buffer %s is in contention\n", net)
                net = vscu_pin_signal((void *) buffer_inst, PIN_BUFFER_OUTIN_ORD);
                vscu_printf("       This is net %s.\n", net);
                vscu_printf("       The output should be high, but it isn't\n");
            }
        break;
    case D0:
        if (outin4 != LOW4)    // check for not high
            {
                char *net,
                net = vscu_get_inst_name((void *)buffer_inst);
                vscu_printf("ERROR: The pin connected to buffer %s is in contention\n", net)
                net = vscu_pin_signal((void *) buffer_inst, PIN_BUFFER_OUTIN_ORD);
                vscu_printf("       This is net %s.\n", net);
                vscu_printf("       The output should be low, but it isn't\n");
            }
        break;
    case D1D0:
        if (outin4 != X4) // check for not high
            {
                char *net;
                net = vscu_get_inst_name((void *)buffer_inst);
                vscu_printf("ERROR: The pin connected to buffer %s is in contention\n", net)
                net = vscu_pin_signal((void *) buffer_inst, PIN_BUFFER_OUTIN_ORD);
                vscu_printf("       This is net %s.\n", net);
                vscu_printf("       The output should be X, but it isn't\n");
            }
        break;
    default:
        // no contention checks.
        break;
    }
// assign values to output.
switch (input)
    {
```

-continued

Appendix 1

```
    case D1:
        buffer_inst->OUTPUT = D1;
        break;
    case D0:
        buffer_inst->OUTPUT = D0;
        break;
    case D1D0:
    case Z:
    default:
        buffer_inst->OUTPUT = Z;
        break;
    }
// schedule output
vscu_sched_output(
                    (void *)buffer_inst,
                    PIN_BUFFER_OUTPUT_ORD,
                    buffer_inst->OUTPUT,
                    C_MODEL_DELAY,
                    INERTIAL_DELAY
                    );
// Was this woken up by a pin changing or a vscu_sched_wakeup?
// Check to see if either of the 2 input pins changed
if ((vscu_pin_changed(buffer_inst, PIN_BUFFER_INPUT_ORD)) ||
    (vscu=pin_changed(buffer_inst, PIN_BUFFER_OUTIN_ORD)))
    {
    // this was caused by a pin changing, therefore check for
    // contention and schedule a wakeup
    vscu_sched_wakeup((void *)buffer_inst, 1);
    }
}
void pin_buffer_restart(pin_buffer_struct *inst_id)
{
    /* assign initial values */
    inst_id -> OUTPUT = Z;
}
void pin_buffer_save(void *inst_id)
{
}
void pin_buffer_restore(void *inst_id)
{
}
void pin_buffer_info(void *inst_id)
{
}
void pin_buffer_close(void *inst_id)
{
    if (inst_id == NULL) return;
    vscu_deallocate(inst_id);
}
```

What is claimed is:

1. A method for simulating the operation of an integrated circuit comprising the steps of:

receiving external inputs to one or more pins of said integrated circuit at a buffer;

simulating operation of said integrated circuit;

receiving outputs from said one or more pins of said integrated circuit at said buffer based on said simulating step;

determining if said inputs to one or more of said pins conflict with said outputs from said pins of said integrated circuit; and notifying a user of said conflict, if present.

2. The method as recited in claim 1 wherein said inputs are inputs to a programmable logic device from an external system, and wherein said outputs are outputs from said programmable logic device.

3. The method as recited in claim 1 wherein said simulating step is a logic simulation step.

4. The method as recited in claim 1 wherein said output of said one or more pins of said integrated circuit is driven by a selectable driver, said selectable driver supplying a selected one of a weak driver and a strong driver.

5. The method as recited in claim 1 further comprising the step of selectively setting said output to a high capacitance state, wherein a prior state of said pin in preserved.

6. Software on a storage medium for modeling operation of an integrated circuit in a system according to the method of claim 1.

7. A computer programmed with the software of claim 6.

8. A method of making an electronic system comprising the steps of:

a) modeling operation of an integrated circuit by the steps of:

selecting operational characteristics of said integrated circuit;

receiving external inputs to one or more pins of said integrated circuit at a buffer;

simulating operation of said integrated circuit;

receiving outputs from said one or more pins of said integrated circuit at said buffer based on said simulating step;

determining if said inputs to one or more of said pins conflict with said outputs from said pins of said integrated circuit;

modifying said selected operational characteristics if said inputs to one or more of said pins conflict with said outputs from said pins of said integrated circuit; and b) operating said integrated circuit with said modified operational characteristics.

9. The method as recited in claim 8 wherein said inputs are inputs to a programmable logic device from an external system, and wherein said outputs are outputs from said programmable logic device.

10. The method as recited in claim 8 wherein said outputs of said one or more pins of said integrated circuit are driven by a selectable driver, said selectable driver supplying a selected one of a weak driver and a strong driver.

11. Software on a computer readable memory, said software for performing the steps of:

receiving external inputs to one or more pins of an integrated circuit at a buffer;

simulating operation of said integrated circuit;

receiving outputs from said one or more pins of said integrated circuit at said buffer based on said simulating step;

determining if said inputs to one or more of said pins conflict with said outputs from said pins of said device; and notifying a user of said conflict, if present.

12. A method for determining whether electrical characteristics of input/output points in an integrated circuit conflict with signals applied to said circuit by an external source, the method using a buffer coupled between said circuit and said external source, the method comprising the steps of:

using said buffer to receive a signal from said external source;

determining whether said received signal is a valid signal according to a predetermined criterion; and if said received signal is a valid signal, then applying said received signal to a predetermined input/output point of said integrated circuit.

13. The method of claim 12, wherein if said received signal is not a valid signal, then performing the step of:

driving a high-impedance state of said predetermined input/output point of the circuit.

14. The method of claim 12, further comprising the step of:

saving the state of the signal from said external source.

15. The method of claim 12, further comprising the step of:

detecting when a signal from said external source and an input/output point of said circuit are respectively trying to output different signal types at the same time and, if so, performing the step of selecting one of the different signal types to apply to the signal and input/output point.

16. A system for simulating the operation of an integrated circuit comprising:

a computer;

peripheral devices enabling a user to interact with the computer in order to input information and commands, and retrieve information;

software tools for circuit design and simulation running on said computer;

an emulator configured to receive external input signals to one or more pins of said integrated circuit, and output signals from one or more pins of said integrated circuit;

a first interface configured to receive said external input signals to said integrated circuit at said buffer;

a simulator configured to simulate the operation of said integrated circuit;

a second interface configured to receive said output signals from said integrated circuit based on said simulating operation at said buffer;

a comparator configured to determine if said inputs to one or more of said pins conflict with said outputs from said pins of said integrated circuit; and an indicator configured to notify a user of said conflict, if present.

17. The software tools of claim 16, wherein said buffer is a software construct comprising:

a process for modeling the pin interface between said integrated circuit and external devices from the external environment into which said integrated circuit is placed, in order to avoid a need for tristating pins of said integrated circuit and pins of said external devices.

18. The software tools of claim 17, wherein said means for modeling said pin interface between said integrated circuit and said external devices from the external environment comprise:

drivers configured to selectively drive the input/output pins of said integrated circuit and said external devices, either actively, passively, or into a state of high impedance;

a memory store for saving the state of the input/output pins of said integrated circuit and said external devices by emulation of a large, non-leaky capacitance;

a third interface for supporting two strengths of output drives from said integrated circuit and said external devices, either a "strong" 1 or 0 (such as, for example, in CMOS and TTL technologies), or a "weak" 1 or 0 (such as, for example, in a resistive pull-up or pull-down interface);

a device for allowing inputs or outputs of said integrated circuit to be forced into a state of "logic X," in which case said inputs or outputs would be maintained in a predefined state of either 1 or 0.

* * * * *